United States Patent
Brychta et al.

(10) Patent No.: US 10,892,925 B2
(45) Date of Patent: Jan. 12, 2021

(54) COMMUNICATION RECEIVER INTERFACE FOR CURRENT LOOP CIRCUIT

(71) Applicant: Analog Devices International Unlimited Company, Limerick (IE)

(72) Inventors: Michal Brychta, Limerick (IE); Alan Patrick Cahill, Edinburgh (GB); Sharad Vijaykumar, Bangalore (IN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/193,739

(22) Filed: Nov. 16, 2018

(65) Prior Publication Data

US 2020/0162293 A1    May 21, 2020

(51) Int. Cl.
 *H04L 27/148* (2006.01)
 *H03K 19/0175* (2006.01)
(52) U.S. Cl.
 CPC ... *H04L 27/148* (2013.01); *H03K 19/017545* (2013.01)
(58) Field of Classification Search
 CPC . H04B 1/04; H04B 1/16; G01D 21/00; H04L 12/10; H04L 27/12; H03C 3/00; H03C 3/02; H03K 19/017545
 USPC ........................................................ 375/334
 See application file for complete search history.

(56) References Cited

U.S. PATENT DOCUMENTS

| | | | |
|---|---|---|---|
| 3,546,639 A | 12/1970 | Drew et al. | |
| 2013/0082667 A1* | 4/2013 | Sinreich | H02J 7/345 |
| | | | 323/234 |
| 2015/0030089 A1* | 1/2015 | Alley | H04B 3/54 |
| | | | 375/258 |
| 2017/0250733 A1* | 8/2017 | Henderson | G08C 19/02 |
| 2017/0366196 A1 | 12/2017 | Lovell et al. | |
| 2020/0162076 A1 | 5/2020 | Cahill et al. | |

FOREIGN PATENT DOCUMENTS

DE    10297504 T5    11/2004

OTHER PUBLICATIONS

Hartmann, Derrick, et al., "Design an Optimized Circuit for Hart-enabled 4-20mA Inputs", Embedded Computer Design, Jul. 2015, Link: http://www.embedded-computing.com/embedded-computing-design/design-an-optimized-circuit-for-hart-enabled-4-to-20-ma-inputs#.
"U.S. Appl. No. 16/193,649, Non Final Office Action dated Jun. 13, 2019", 11 pgs.
"U.S. Appl. No. 16/193,649, Response filed Sep. 13, 2019 to Non-Final Office Action dated Jun. 13, 2019", 12 pgs.
"German Application Serial No. 102019130814.3, Office Action dated Aug. 6, 2020", w/o English Translation, 8 pgs.

* cited by examiner

*Primary Examiner* — Leila Malek
(74) *Attorney, Agent, or Firm* — Schwegman Lundberg & Woessner, P.A.

(57) ABSTRACT

Techniques are provided for an integrated circuit, current loop interface that can receive and extract a high-frequency digital communication signal from a low-frequency analog current signal using a complex impedance circuit. The complex impedance circuit can allow for low input impedance at the lower frequencies of the analog current signal and high input impedance at the higher frequencies of the digital communication signal.

22 Claims, 5 Drawing Sheets

COMMUNICATION RECEIVER INTERFACE FOR CURRENT LOOP CIRCUIT

TECHNICAL FIELD OF THE DISCLOSURE

The present disclosure relates to reception of combined signals, and more particularly, to energy efficient methods of receiving a digital communication signal that is combined with a current loop signal.

BACKGROUND

Distributed process control systems, like those used in chemical, petroleum, industrial or other process plants to manufacture, refine, transform, generate, or produce physical materials or products typically include one or more process controllers communicatively coupled to one or more field devices via analog, digital or combined analog/digital buses, or via a wireless communication link or network. The field devices, which may be, for example, valves, valve positioners, switches and transmitters (e.g., temperature, pressure, level and flow rate sensors), are located within the process environment and generally perform physical or process control functions such as opening or closing valves, measuring process and/or environmental parameters such as temperature or pressure, etc. to control one or more processes executing within the process plant or system. Smart field devices, such as the field devices conforming to the well-known Fieldbus protocol may also perform control calculations, alarming functions, and other control functions commonly implemented within the controller. The process controllers, which are also typically located within the plant environment, receive signals indicative of process measurements made by the field devices and/or other information pertaining to the field devices and execute a controller application that runs, for example, different control modules which make process control decisions, generate control signals based on the received information and coordinate with the control modules or blocks being performed in the field devices, such as HART®, WirelessHART®, and FOUNDATION® Fieldbus field devices. The control modules in the controller send the control signals over the communication lines or links to the field devices to thereby control the operation of at least a portion of the process plant or system, e.g., to control at least a portion of one or more industrial processes running or executing within the plant or system. In some applications, an analog, or low frequency, current loop control medium, such as wire conductors, can be used to simultaneously communicate analog, low frequency, process information and digital, high-frequency process information. There are opportunities for tighter integration of a high-frequency digital receiver with the integrated circuit of the current loop interface that can save power.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Current loop systems can provide analog control and sensing mechanisms to many applications. Some current loop systems can simultaneously provide analog control or sensing (uni-directional) and superimposed, digital (bidirectional) communication between a field device and a controller. Input impedance can affect the successful reception of both the analog signal and the digital communication signal and systems can often include a minimum impedance to assure proper operation. However, for the analog control or sensing signal, smaller input impedance can save power and reduce heating of interface components of the current loop system. The present inventors have recognized techniques for presenting low input impedance to a channel of an analog current loop system at low frequencies and higher input impedance at frequencies associated with a digital communication protocol of the current loop system.

Figure 1:
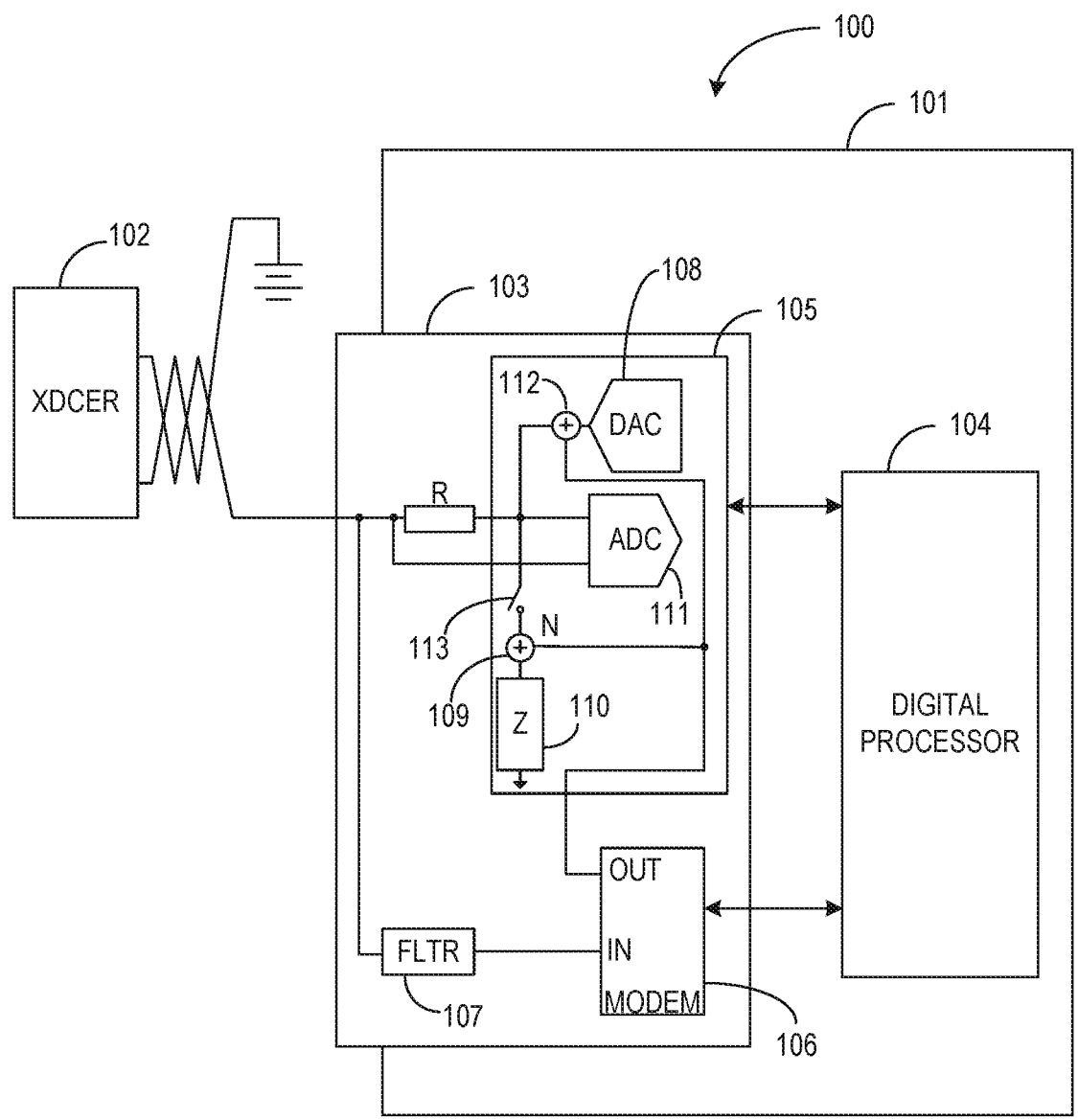
FIG. 1 illustrates generally an example of a current loop system according to various examples, of the present subject matter.

FIG. 1 illustrates generally an example of a current loop system 100 according to various examples of the present subject matter. The current loop system 100 can include a controller circuit 101 and one or more field devices 102. The control circuit 101 can come in various forms. An example form can include one or more input/output (I/O) modules 103 and a digital processor 104. In certain examples, the field device 102 can be a sensor transducer. In some examples, the filed device 102 can be an actuator transducer. In some examples, the field device 102 can include a sensor transducer and an actuator transducer. Sensor transducers can control a level of current of the current loop based on a sensed condition. Actuator transducers can operate an actuator device based on a level of current received via the current loop. Industrial control applications often use current loops to communicate analog or discrete information between the field and a process controller. Such industrial systems typically allow the current to vary between 4 milliamps (mA) and 20 mA, however, other ranges of current are possible without departing from the scope of the present subject matter.

In certain applications, the controller circuit 101 can receive information from one or more sources, such as a current loop sensor, and can control various actuators or indicators, including, for example, a current loop actuator. In some applications, the controller circuit 101 can be a programmable logic controller (PLC). PLCs can include a main processor 104 that interfaces with multiple forms of input and output (I/O) modules or interfaces, such as digital input modules, digital output modules, analog input modules, analog output modules, heater modules, burner control modules, servo control modules, etc. In certain examples, an I/O module 103 can include an analog current loop interface 105. The analog current loop interface 105 can be one form of such modules and can provide a bridge between digital controller data of the controller 104 and analog current loop levels of the current loop transducer 102. In certain examples, the analog control loop interface circuit 105 can include multiple current loop channels. In some examples, each channel can be programmable to operate as an analog current input, an analog current output, a discrete input, or a discrete output. In certain examples, a single integrated circuit can include the analog current loop interface 105. In certain examples, the analog current loop interface 105 can include one or more converters 108, 111 to convert between the analog and digital control environments of the current loop system 100. For analog input channels, a series connected resistor (R) can convert the analog current signal to a voltage and the voltage can be received by an analog-to-digital converter (ADC) to provide a digital representation of low frequency analog current signal to the digital processor (DP) 104.

In certain examples, an I/O module 103 including the analog current loop interface 105 can also include a modem 106 for high-speed communication using the current loop medium. In certain examples, the modem 106 can include a transmitter, a receiver, a transmitter and a receiver, or a transceiver. In certain examples, a single integrated circuit can include the modem 106. In some examples, the modem 106 is specifically designed to provide digital-over-analog communication. In certain examples, the modem 106 is a frequency shift key (FSK) type modem. In certain examples, the modem 106 employs a highway addressable remote transducer (HART) protocol that can communicate with one or more external devices such as smart transducers via a point-to-point mode or via a multi-drop mode. In certain examples, the analog current loop interface 105 can include one or more mixers 109, 112 to assist in mixing the high-frequency communication signal of a transmitter of the modem 106 with the analog current signal of the analog current loop interface 105. In certain examples employing a modem, the current loop interface 105 can include a switch circuit 113 that can be "open" when the channel of the current loop interface 105 is programmed as an output channel and can be "closed" when the channel of the current loop interface 105 is programmed as an input channel.

The present inventors have recognized opportunities for power saving schemes for improved integration of a HART-type receiver with a current loop interface circuit 105. More particularly, the present inventors have recognized solutions to allow robust reception of the high-speed digital communication using relatively high input impedance while also receiving the analog current signal using relatively low input impedance. Although one impedance can be used to accommodate both high-speed communication and analog current detection, a dynamic impedance solution can reduce power consumption by providing a lower input impedance at the low frequencies of interest for the analog current function and at least a minimum, higher impedance at the higher frequencies of the high-speed communication function. In certain examples, improved integration can be employed without using a bulky transformer, inductor or other magnetic component.

For example, for recovery of the digital high-speed communication signal at the input (IN) of the modem 106, a receiver device, such as the I/O module 103 and analog current loop interface 105, can present a minimum 230Ω input impedance in the digital communication frequency band to the current loop network. The high-speed HART communication current signal from a remote transmitter flows through the input impedance, and the resulting voltage developed across the input impedance can be processed by the modem receive circuitry. Typical implementations often use a 250Ω resistor to provide the input impedance. However, the DC voltage developed across the screw terminals due to the low-frequency analog 4-20 mA current flowing through the input impedance can result in considerable heat dissipated by the input resistor and within in the module. The present inventors have recognized several variations of on-chip complex impedance elements 110 that can present a higher impedance to frequencies in the high-frequency digital communication signaling spectrum and a lower impedance to lower frequency/DC analog signals, thereby allowing for high-frequency communications via a medium also providing low-frequency analog current signaling while reducing module power loss. In certain examples, even with a complex impedance circuit 110 (Z), an optional small filter 107 may also be used with the receiver of the modem 106 in certain situations. In the illustrated examples, the sum of the illustrated resistor (R) and the complex impedance 110 can provide the input impedance when a channel of the I/O module is configured as an analog input or a digital input.

Figure 2:
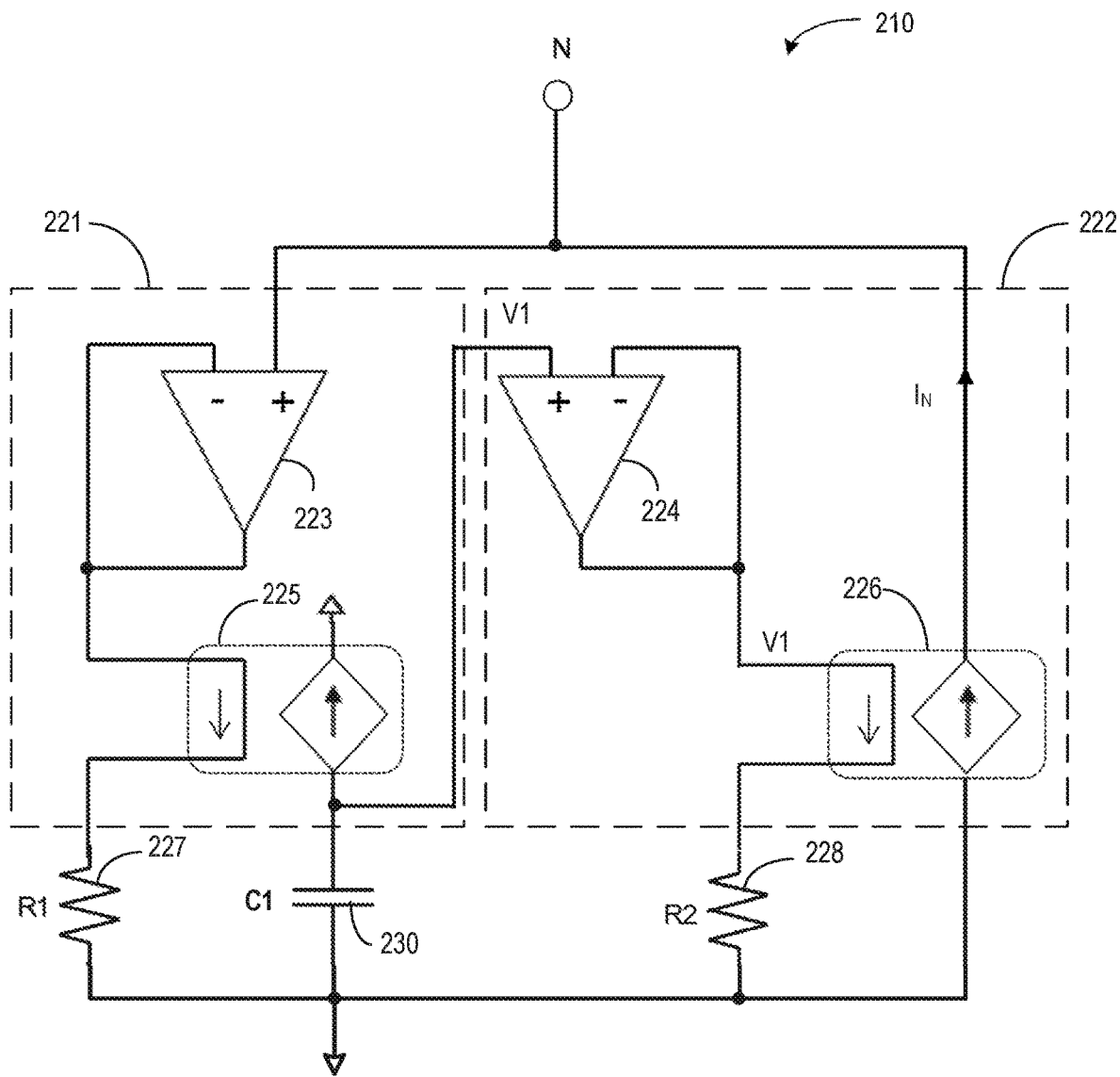
FIG. 2 illustrates generally an example of a complex impedance element according to the present subject matter.

FIG. 2 illustrates generally an example of a complex impedance element 210 according to the present subject matter. The complex impedance element 210 can be part of an input module (FIG. 1, 103) that can receive the low-frequency analog current signal. In certain examples, the complex impedance element 210 can be part of an integrated circuit including the analog current loop interface (FIG. 1, 105). In certain examples, the complex impedance element 210 can include a cross-coupled amplifier circuit that includes a first current conveyor 221 and a second current conveyor 222 that in combination can simulate a grounded inductor. Each current conveyor 221, 222 can include an amplifier 223, 224 and a current controlled current source 225, 226 coupled to a feedback path of each amplifier 223, 224. A first input of each amplifier 223, 224 can be coupled to a current controlled current source 225, 226 of the other current conveyor 221, 222. A second input of each amplifier 223, 224 can be coupled to ground via a resistor 227, 228. A first terminal (N) of the complex impedance element 210 can be coupled to the first input of the amplifier 223 of the first current conveyor 221. The first terminal (N) of the complex impedance element 210 can be coupled to the current loop conductor of the current loop module (e.g., FIG. 1, 103). A second terminal of the complex impedance element 210 can be coupled to ground. The magnitude of the emulated impedance can be set using the sizes of the two resistors 227, 228 and the capacitor 230. In certain examples, the common-mode bias points of the current conveyors 221, 222 can be set to fix the input DC bias point to allow for circuit headroom.

In general, the amplifier 223 of the first current conveyor 221 can servo the voltage at first node (N) of the complex impedance 210 across a first resistor 227 such that the current through the first resistor 227 is $V_N/R1$. The current controlled current source 225 of the first current conveyor 221 can then integrated a scaled, or equivalent, version of the current of the first resistor 227 via the capacitor 230. The voltage (V1) across the capacitor 230 can be given by: $V1=(1/C1)\int V_N/R1\, dt$. The voltage (V1) across the capacitor can then be buffered by amplifier 224 of the second current conveyor 222 to the second resistor 228 (R2), and results in the voltage (V1) across the second resistor 228 (R2) and provides a current through the second resistor given by V1/R2. The current controlled current source 226 of the second current conveyor 222 can then integrate a scaled, or equivalent, version ($I_N$) of the current of the second resistor (R2) 228 to flow via the first node (N) of the complex impedance 210. The node current ($I_N$) can be given by:

$$I_N = V1/R2.$$

Substituting the equation above for V1, $$I_N=((1/C1)\int V_N/R1 dt)/R2.$$

Simplifying, $$I_N=(1/C1R1R2)\int V_N dt.$$

Solving for $V_N$, $$V_N=C1R1R2 dI_N/dt.$$

As such, the complex impedance resembles and acts like an inductor with a value of C1R1R2. Furthermore, the complex impedance can provide a higher impedance for the high frequency communication signals and a lower impedance for the low frequency analog current signals. In certain examples, the impedance at high frequencies can be limited by including a resistor coupled in parallel with the circuit of FIG. 2. The higher impedance at the higher frequencies of the communication signal can allow the communication signal to be robustly extracted from the current loop without significant energy loss in simultaneously receiving the low-frequency analog current signal. Additionally, in certain examples, the complex impedance circuit 210 can be easily implemented in the same integrated circuit as the current loop interface (e.g., FIG. 1, 105) with little if any increase in size of the current loop interface integrated circuit.

Figure 3A:
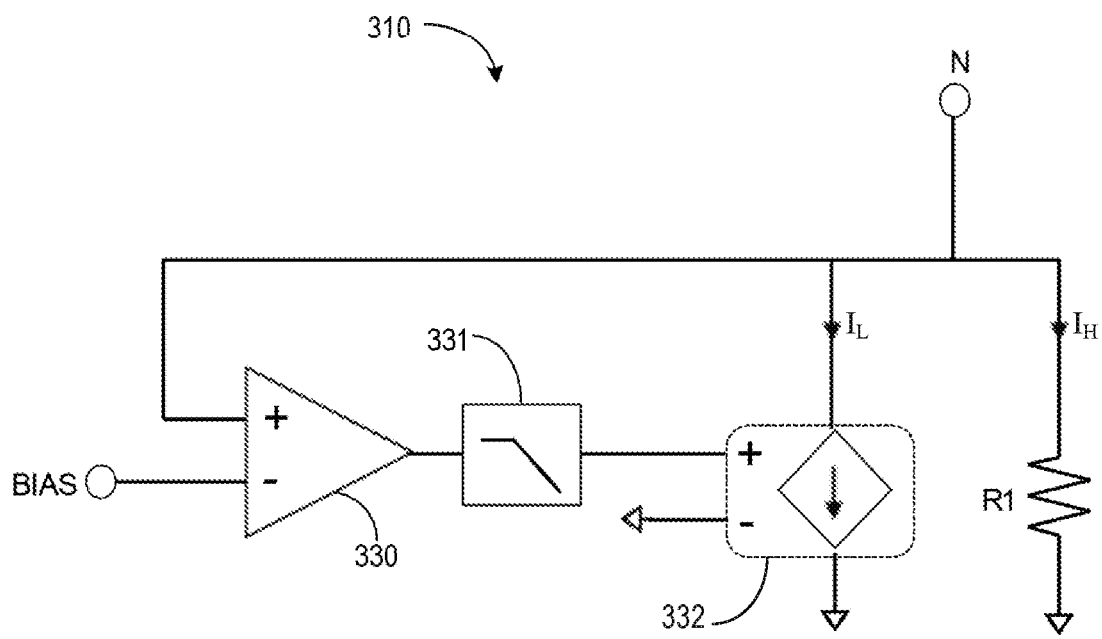
FIGS. 3A and 3B illustrate generally an example complex impedance element according to the present subject matter.
Figure 3B:
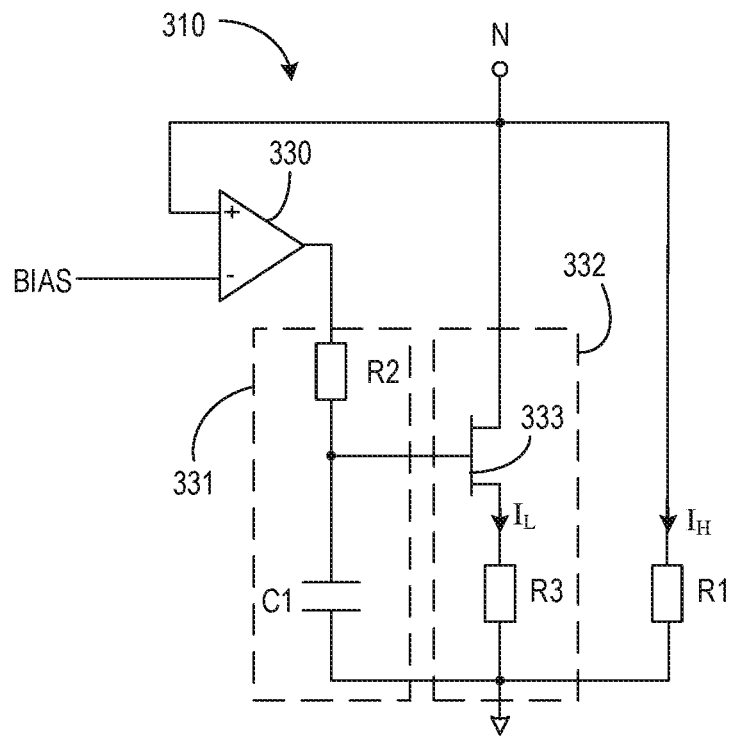

FIG. 3A illustrates generally an example of a complex impedance element 310 according to the present subject matter. FIG. 3B illustrates generally a detail of an example implementation of the complex impedance element 310 of FIG. 3A. The complex impedance element 310 is intended to again simulate an inductor or inductor-resistor network. The complex impedance element 310 can include an amplifier 330, a low-pass filter 331, a voltage controlled current source 332, and a resistor (R1). In certain examples, the amplifier 330 can receive a bias voltage (BIAS) and can try to servo the bias voltage (BIAS) at the first node (N) via the low-pass filter 331 and voltage-controlled current source 332. However, the servo control loop is purposely configured as a low-bandwidth loop such that low frequency signals ($I_L$) see very low impedance via the path of the voltage-controlled current source 332 as opposed to the path of the resistor (R1). For high-frequency signals ($I_H$), the servo control loop does not effectively close the loop and the voltage-controlled current source 332 appears as a high impedance. Thus, high-frequency signals ($I_H$) can pass via the resistor (R1) which can be sized to provide the minimum input impedance for robust high frequency communication reception. In FIG. 3B, the low-pass filter 331 can include a second resistor (R2) coupled in series with a capacitor (C1). The voltage controlled current source can include a transistor 333 coupled to the capacitor (C1) and a third resistor (R3). In one example, the first resistor (R1) can be on the order of about 330Ω, the second resistor (R2) can on the order of 1 MΩ, and the third resistor can be an optional current limiting resistor. It is understood that other component values, such as resistance, are possible without departing from the scope of the present subject matter.

Figure 4A:
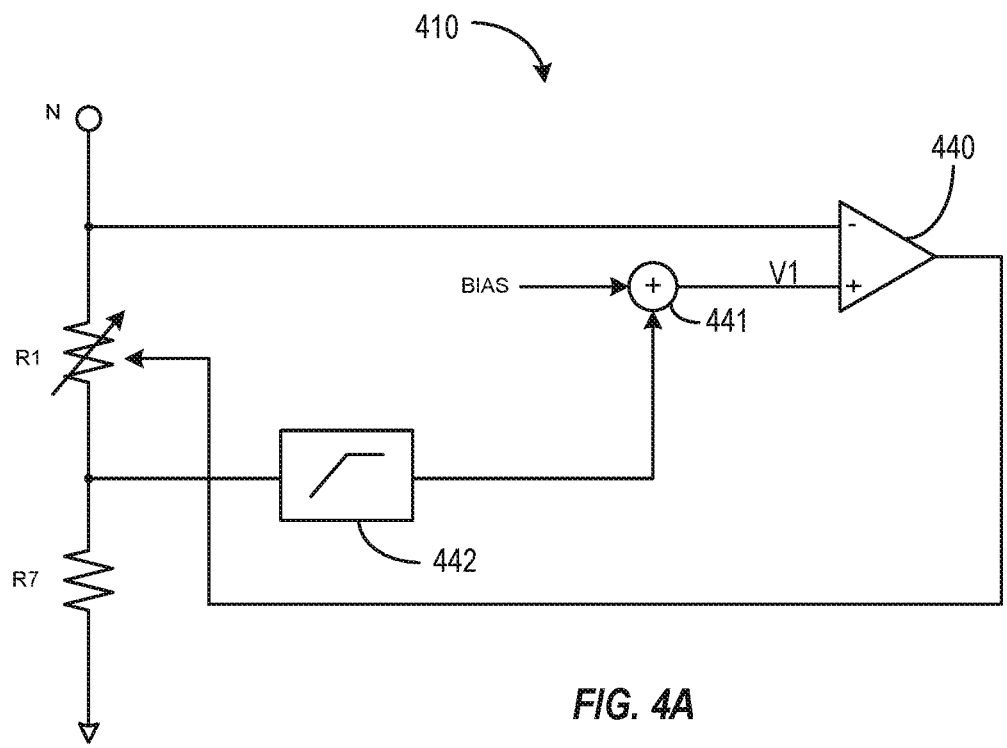
FIGS. 4A and 4B illustrate generally an example of a complex impedance circuit according to the present subject matter.
Figure 4B:
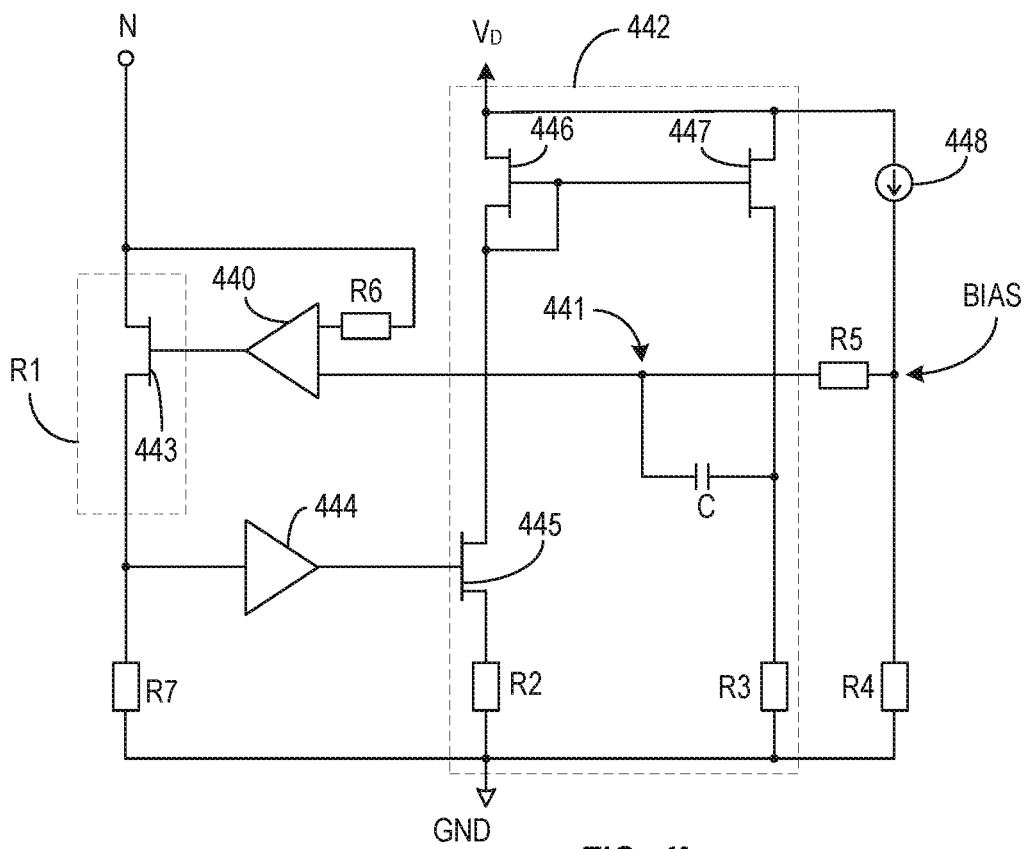

FIG. 4A illustrates generally an example of a complex impedance circuit 410 according to the present subject matter. FIG. 4B illustrates generally a detail of an example implementation of the complex impedance element 410. The complex impedance circuit 410 can include a voltage-controlled resistor (R1), a sense resistor (R7), an amplifier 440, a summing node 441, and a high-pass filter 442. The amplifier 440 can receive a bias that comprises a steady-state bias (BIAS) and an amplified high-frequency component of the signal received across sense resistor R7. The amplified high-frequency component of the signal can be provided at the output of the high-pass filter 442. The steady-state bias (BIAS) and the amplified high-frequency component are summed at the summing node 441 and provided to a first input of the amplifier 440 as a summed voltage (V1). The amplifier 440 can servo the summed voltage (V1) at the first node (N) using the voltage-controlled resistor (R1). In general, the complex impedance circuit 410 functions to amplify the resulting voltage of high-frequency current components into the first node (N) and can attenuate the resulting voltage of low frequency current signals. As such, the complex impedance circuit 410 can present a higher impedance for higher frequency input currents and thus provide an input impedance for robust reception of the high-frequency communication signal.

In FIG. 4B, the voltage-controlled resistor can include a first transistor 443 and a sense resistor (R7). A buffer amplifier 444 can buffer the signal received at the sense resistor (R7) and provide the buffered signal to the high-pass filter 442. The high-pass filter can include a current mirror circuit including an input transistor 445, a pair of transistors 446, 447 arranged to form a current mirror, a couple of resistors (R2, R3), and a capacitor (C). In certain examples, the current mirror 446, 447 can provide amplification gain for the amplified high frequency component discussed above. The steady-state bias (BIAS) can be generated using a current source 448 and a fourth resistor (R4). The steady state bias (BIAS) can be DC coupled to the summing node. The high-frequency component can be AC-coupled via the capacitor (C) of the high pass filter 442. Additional resistors (R5, R6) can provide isolation, current limiting, gain setting, or combinations thereof.

Figure 5:
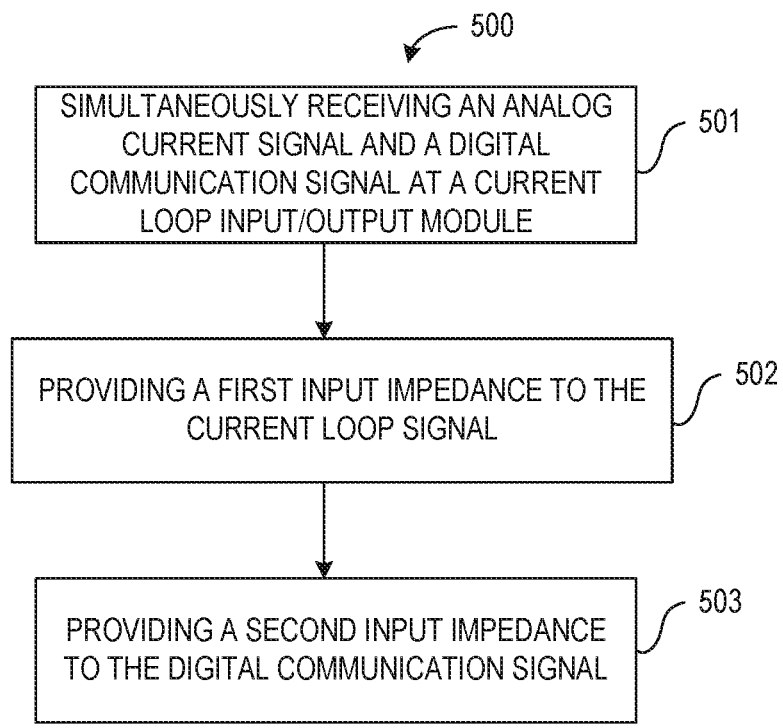
FIG. 5 illustrates generally a flow chart of an example method for operating a current loop circuit with a complex impedance circuit.

FIG. 5 illustrates generally a flow chart of an example method 500 for operating a current loop circuit with a complex impedance circuit. At 501, a current loop signal and a digital communication signal can simultaneously be received at terminals of a channel of an I/O module. At 502, a complex impedance circuit of the I/O module, or a current loop interface, can provide a first input impedance to the current loop components received at low frequencies including DC or 0 Hz. In certain examples, the range of low, or lower, frequencies can correspond to frequencies associated with mechanical systems and can be limited from DC to about 200 Hz or lower. In certain examples, the complex impedance circuit is configured to maintain a very low input impedance to the analog current signal because with the lower input impedance, less power is lost as heat. In some example, the first input impedance is around 100 ohms or less. At 503, the complex impedance circuit can provide a second input impedance to digital communication signal components received at higher frequencies. In certain examples, reception of the digital communication signal can rely on an input impedance within a range of impedances. In some examples, the second input impedance is between 230 ohms and 600 ohms. In certain examples, the digital communication signal can include an FSK signal. In some example, the FSK signal can shift between two frequencies to indicate a bit level of the digital communication signal. In an example, the two frequencies can be 1200 Hz and 2200 Hz. In certain examples, the digital communication signal can transfer information at 1200 baud. A conventional solution to robustly receiving the digital communication signal can be to use a 250 ohm resistor for reception of both the digital communication signal and the current loop signal, such a solution consumes much power as the energy loss in the resistor is proportional to the resistor size. In some examples, the complex impedance circuits discussed above allow for low power loss reception of the analog, low-frequency current signal and robust reception of the high-frequency digital communication signal.

VARIOUS NOTES & EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A current loop interface circuit configured to couple to and communicate information with an external device based on a level of current of a first current signal, the current loop interface circuit including an integrated circuit comprising:
   an analog-to-digital converter;
   control logic configured to enable the analog-to-digital converter to provide a multiple-bit, digital representation of the level of the current of the first current signal in a first configuration;
   a complex impedance circuit configured to modulate an input impedance of the current loop interface circuit to recover a frequency shift key (FSK) signal from the first current signal, including modulating a first input impedance of the current loop interface circuit at a first frequency range of the FSK signal and a second input impedance of the current loop interface circuit at a second frequency range of a current loop signal of the first current signal, the second frequency range of the current loop signal is below the first frequency range of the of the FSK signal; and
   a first node configured to couple to a FSK receiver and to provide the FSK signal recovered from the first current signal to the FSK receiver.

2. The current loop interface circuit of claim 1, wherein the complex impedance circuit does not include an inductor.

3. The current loop interface circuit of claim 1, wherein the complex impedance circuit includes a cross-coupled amplifier circuit.

4. The current loop interface circuit of claim 3, wherein the cross-coupled amplifier circuit includes a first current conveyor and a second current conveyor coupled in parallel;
   wherein each of the first current conveyor and the second current conveyor includes:
   an amplifier,
   a feedback loop configured to couple an output of the amplifier with a first input of the amplifier; and
   a current-controlled current source coupled to the output of the amplifier;
   wherein the cross-coupled amplifier circuit includes a capacitor coupled to an output of the current-controlled current source of the first current conveyor;
   wherein the current-controlled current source of the first current conveyor is coupled to a second input of the amplifier of the second current conveyor; and
   wherein the current-controlled current source of the second current conveyor is coupled to the second input of the amplifier of the first current conveyor.

5. The current loop interface circuit of claim 1, wherein the complex impedance circuit includes:
   an amplifier configured to modulate a bias voltage at a second node configured to receive the first current signal;
   a low pass filter;

a voltage controlled current source configured to receive an output of the amplifier via the low-pass filter and to modulate a current of the second node; and a first resistor coupled in parallel with the voltage controlled current source.

6. The current loop interface circuit of claim 5, wherein the low pass filter includes a second resistor coupled to the output of the amplifier and a capacitor coupled in series with the resistor.

7. The current loop interface circuit of claim 6, wherein the voltage controlled current source includes a transistor coupled to the second node and in series with a third resistor, wherein a control node of the transistor is configured to receive a voltage across the capacitor.

8. The current loop interface circuit of claim 6, wherein a control loop of the amplifier including the voltage controlled current source is configured to maintain the transistor in a first impedance state for low frequency components of the first current signal and to maintain the transistor in a second impedance state for high frequency components of the first current signal;

wherein the impedance of the first impedance state is lower the impedance of the second impedance state.

9. The current loop interface circuit of claim 1, wherein a second configuration of the control logic is configured to provide a binary output representative of the level of the current of the first current signal.

10. The current loop interface circuit of claim 1, wherein the control logic further configured to enable a digital-to-analog converter to modulate the level of the current of the first current signal based on the multiple-bit, digital representation in a first configuration.

11. The current loop interface circuit of claim 10, wherein a second configuration of the control logic is configured to receive a bit representative of one of two binary levels of the first current signal and to enable the digital-to-analog converter to modulate the level of the current of the first current signal based on the bit.

12. A method of operating a current loop input module, the method comprising:

receiving a current loop signal at first and second terminals of the current loop input module;

receiving a digital communication signal simultaneously with the current loop signal at the first and second terminals;

providing a first input impedance of the current loop input module to the current loop signal at a first frequency range;

providing a second input impedance of the current loop input module to the digital communication signal at a second frequency range; and wherein the first input impedance is less than the second input impedance;

wherein the first frequency range is less than 200 Hz; and wherein the second frequency range is greater than 1 kHz.

13. The method of claim 12, wherein the second input impedance is between 230 ohms and 600 ohms.

14. The method of claim 12, wherein the first input impedance is between 10 ohms and 150 ohms.

15. The method of claim 12, wherein providing the second input impedance includes:

receiving the current loop signal and the digital communication signal at a complex impedance circuit of the current loop input module, the complex impedance circuit coupled to one terminal of the first and second terminals;

filtering a level of the digital communication signal using a first current conveyor amplifier;

feeding back an output signal of the first current conveyor amplifier to an amplifier of a second current conveyor circuit; and adjusting a current of the one terminal using an output of the amplifier of the second current conveyor circuit.

16. The method of claim 12, wherein the digital communication signal is a frequency shift key (FSK) signal.

17. The method of claim 12, including extracting the digital communication signal from the current loop signal using a pair of current conveyors of a complex impedance circuit.

18. The method of claim 12, including sensing the digital communication signal using a high pass filter of a complex impedance circuit; and adjusting a current of a sense resistor of the complex impedance circuit using an output of the high pass filter to adjust the second input impedance of the current loop input module at the second frequency range.

19. The method of claim 12, wherein receiving the current loop signal and receiving the digital communication signal includes:

simultaneously receiving the current loop signal and receiving the digital communication signal at a current source circuit;

maintaining a voltage across the current source circuit using a frequency-limited control loop; and extracting a level of the digital communication signal using the voltage across the current source circuit at frequencies beyond a controllable range of the frequency-limited control loop.

20. A current loop interface circuit configured to couple to and communicate information with an external device based on a level of current of a first current signal, the current loop interface circuit comprising:

a resistor configured to convert the level of current of the first current signal to a voltage representative of the level of current of the first current signal;

control logic configured to enable an analog-to-digital converter to provide a multiple-bit digital representation of the voltage representative of the level of the first current signal in a first configuration; and complex impedance means for modulating an input impedance of the current loop interface circuit to accommodate reception of a digital signal modulated with the first current signal based on the multiple-bit digital representation.

21. The current loop interface circuit of claim 20, wherein the digital signal is a frequency shift key (FSK) signal.

22. The current loop interface circuit of claim 20, wherein the resistor is less than 150 ohms.

* * * * *